United States Patent [19]

Pelgrom et al.

[11] Patent Number: 4,771,445
[45] Date of Patent: Sep. 13, 1988

[54] CHARGE-COUPLED DEVICE HAVING AN IMPROVED INPUT STAGE

[75] Inventors: Marcellinus J. M. Pelgrom; Hendrik Heijns, both of Eindhoven, Netherlands

[73] Assignee: U.S. Philips Corporation, New York, N.Y.

[21] Appl. No.: 33,141

[22] Filed: Mar. 31, 1987

[30] Foreign Application Priority Data

Apr. 9, 1986 [NL] Netherlands ............ 8600890

[51] Int. Cl.$^4$ .................. G11C 19/28; H01L 29/78
[52] U.S. Cl. ............................ 377/60; 357/24
[58] Field of Search ....................... 377/57–63; 357/24

[56] References Cited

PUBLICATIONS

Wallinga "A Comparison of CCD Analog Input Circuit Characteristics", Int. Conf. Technology and Applications of Charge Coupled Devices, Edinburgh (9/74), pp. 13–21.
Beynon et al., Eds., *Charge-Coupled Devices and Their Applications*, McGraw-Hill, London (1980), pp. 187–189.

*Primary Examiner*—Gene M. Munson
*Attorney, Agent, or Firm*—Algy Tamoshunas; Steven R. Biren

[57] ABSTRACT

The invention relates to a CCD having a so-called diode cut-off input, in which the input diode is applied to a reference voltage and the input signal is supplied to the input gate located in front of the first clock electrode. More particularly, if the electrodes are composed of a transfer part and a storage part with an incorporated potential difference, it is possible that, when charge is transported from the input gate to the first clock electrode, a large amount of charge is left behind. In order to avoid this and/or to be able to enlarge the dynamic range of the input signal, a MOST switch controlled by the same clock voltage as the first clock electrode is arranged between the input gate and a reference voltage, for example ground. This switch becomes conducting when the charge is transferred, as a result of which the potential level below the input gate can be adjusted above the surface potential below the transfer part of the first clock electrode.

3 Claims, 2 Drawing Sheets

CHARGE-COUPLED DEVICE HAVING AN IMPROVED INPUT STAGE

BACKGROUND OF THE INVENTION

The invention relates to a semiconductor device having a charge-coupled device provided at a surface of a semiconductor body and comprising an input stage for forming charge packets in dependence upon an input signal, a row of clock electrodes provided with connection means for applying clock voltages on behalf of the sequential storage and transport of these charge packets in an underlying charge transport channel, the input stage comprising, viewed in the charge transport direction, in order of succession an input diode, a first electrode (designated hereinafter as sample gate) and a second electrode (designated hereinafter as input gate), while the input diode is provided with a connection for applying a fixed voltage, the input gate is provided with means for applying the input signal and the sample gate is provided with means for applying a sample clock voltage for closing the connection between the input diode and the region below the input gate.

A charge-coupled device having such an input stage, (designated as SHC2 (sample and hold circuit 2) is described inter alia in the article "A comparison of CCD Analog Input Circuit Characteristics" by H. Wallings, International Conference on Technology and Applications of Charge-Coupled Devices, Edinburgh, September 1974, p. 13-21. For further background, see also "IEEE Journal of I.S.C.", Vol. SC-13, No. 5, pp. 542-548 (October 1978). Such an input can be used not only in analog applications, but also advantageously in digital applications and is particularly suitable for use at high frequencies. The first-mentioned publication indicates as a disadvantage of this input stage that special steps should be taken to guarantee that the charge packet formed below the input gate is transferred as a whole to the storage zone below the adjacent first clock electrode. The problem of incomplete charge transport arises especially in known charge-coupled devices in which the clock electrodes have a transfer part and a storage part, internal means being provided (such as thicker oxide or an implantation), by which upon application of voltages a potential barrier is formed below the transfer part and a potential well is formed below the storage part. As will appear from the description of the Figures, due to this potential barrier, the range within which the input signal can vary is very small because of the requirement that the whole charge packet must be transferred.

SUMMARY OF THE INVENTION

The invention has for its object to provide a semiconductor device of the kind described above in which the problem of incomplete charge transport at the input stage is avoided in a simple manner.

For this purpose, a semiconductor device according to the invention is characterized in that the input stage is connected not only to means for applying the input signal but also to one of the main electrode regions of an insulated gate field effect transistor, of which the other main electrode region can be applied to a fixed potential and of which the gate electrode is provided with connection means for applying one of the said clock voltages. The field effect transistor can be closed synchronously with the clock voltages and with the clock voltage applied to the sample gate, as a result of which a lower voltage can be applied to the input gate for the time in which the charge is stored below the first clock electrode. This requires only a single field effect transistor. Since such transistors can be made very small and since no additional clock generator is required for driving this transistor, the solution given here substantially does not require additional space in the semiconductor body.

BRIEF DESCRIPTION OF THE DRAWING

The invention will be described more fully with reference to an embodiment and the accompanying diagrammatic drawing, in which.

DESCRIPTION OF THE PREFERRED EMBODIMENTS

The invention will be explained with reference to a surface channel CCD. Although the invention in itself may also be used in charge-coupled devices having a buried channel (BCCD), charge-coupled devices having a surface channel are often preferred for certain applications, for example those in which stringent requirements are imposed on linearity.

Figures 1, 2:
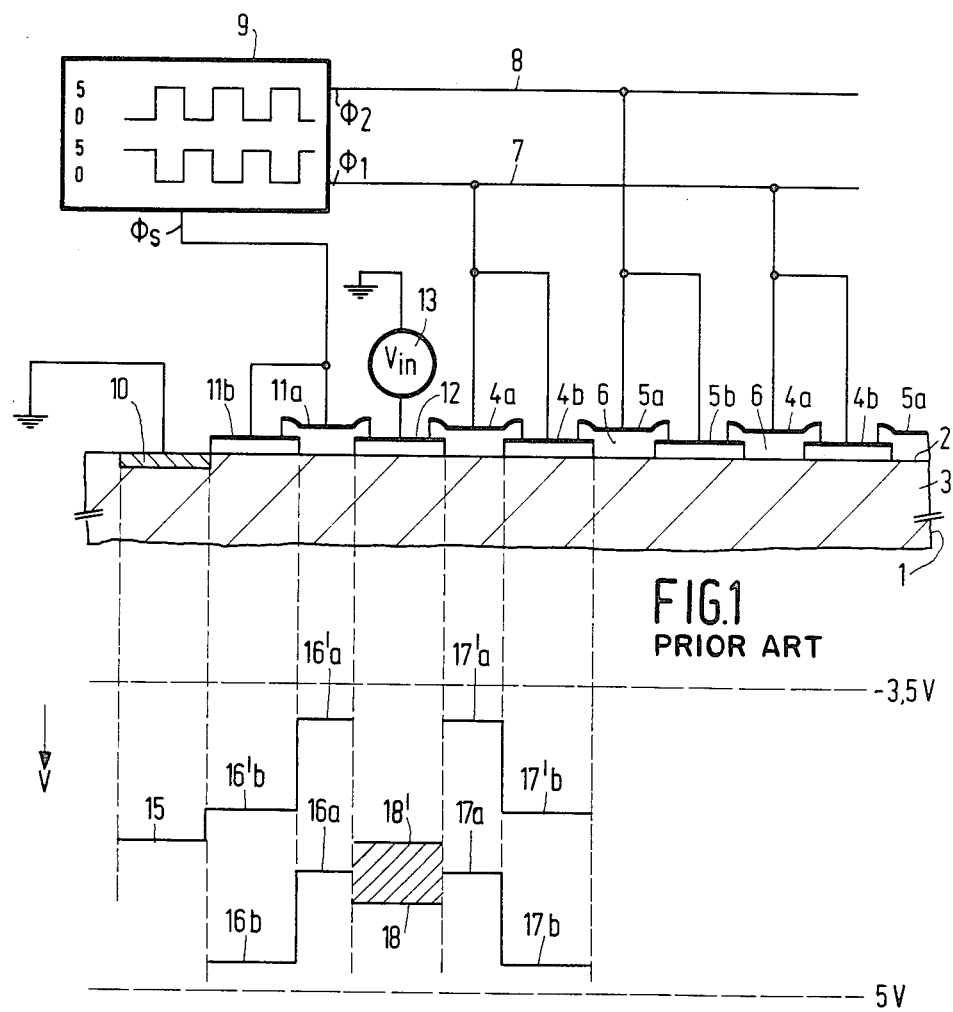
FIG. 1 shows a charge-coupled device, in which the input signal is applied to the input gate in a conventional manner.
FIG. 2 shows a diagram of the potential distribution in this device during operation.

In order to explain the problem to be solved by the invention, FIG. 1 shows a prior art charge-coupled device as described above, which is controlled by the usual clock voltages. The device, which in this case is of the n-channel type, but may of course also be of the p-channel type, comprises a p-type semiconductor body 1 of, for example, silicon, at whose major surface 2 the channel 3 is provided. For controlling the charge transport through the channel 3, the surface 2 is provided with a row of clock electrodes 4, 5, which are separated from the surface by an intermediate oxide layer 6. The clock electrodes each comprise a transfer part a and a storage part b, these parts being distinguished from each other by means which are present to induce upon the application of a clock voltage a potential barrier below the transfer part a and a potential well below the storage part b in the channel 3. In the present embodiment, these means are constituted by the thicker oxide 6 below the transfer parts 4a,5a and the thinner oxide below the storage parts 4b,5b. As a matter of course, these means may also comprise other known means for varying the threshold voltage, such as, for example, regions implanted in the channel. In the embodiment to be described here, the electrode configuration with transfer part and storage part is used for the two-phase mode of operation.

However, in other embodiments, this electrode configuration serves to operate the device as a ripple phase device or a bit-per-electrode device, in which all of the storage sites but one are filled with information and the vacancy is displaced in the direction opposite to the charge transport direction.

The clock electrodes 4,5 are connected in a known manner through clock lines 7 and 8, respectively, to a clock voltage source 9, which supplies the clock voltages $\phi_1,\phi_2$ indicated diagrammatically in the block 9.

The input of the charge-coupled device comprises, viewed in the charge transport direction (from the left to the right), in order of succession: an n+ source zone 10, which is designated hereinafter as input diode and supplies electrons for the formation of the charge packets; a first electrode 11, which constitutes a sample gate, and a second electrode 12, which constitutes the input gate.

The input diode 10 is connected to a fixed potential, for example ground. The input gate 12 is connected to a voltage source 13 which comprises a signal source supplying a signal-dependent voltage to the input electrode 12, which determines the size of the charge packet to be formed below the input electrode 12. The sample electrode 11, which for reasons of manufacturing technology is composed in the same manner as the clock electrodes 4,5 of a part 11a on thicker oxide and a part 11b on thinner oxide, serves as a switch between the input diode 10 and the storage region below the input electrode 12. A sample clock $\phi_s$ supplied by the source 9 is applied to the sample gate 11.

During operation, the body 1 is applied to a reference voltage of, for example, $-3.5V$, while clock voltages $\phi_1$, $\phi_2$ having levels of 0 and 5V are applied to the clock electrodes 4,5. The clock $\phi_2$ also varies between 0 and 5V. FIG. 2 shows the potential distribution occurring at these voltages in the input part of the device, the quantity V representing the surface potential, which is plotted, as usual, in downward direction. In the Figure, the potential levels of substrate voltage and 5V are also indicated by broken lines. The level 15 represents the potential level of the input diode 10. The surface potential below the sample gate 11 is denoted by reference numeral 16, the suffices a and b representing the potentials below the parts 11a and 11b, respectively. The potential 16'a,16'b occurs at a clock voltage $\phi_s=0V$, while the potential 16a,16b occurs at a clock voltage $\phi_s=5V$. As appears from the diagram, a flow of electrons from the input diode 10 to the region below the input gate 12 is possible at $\phi_s=5V$, while this flow is blocked at $\phi_s=0V$. In an analogous manner, the levels 17a,b,17'a,b represent the potentials below the first clock electrodes 4a,4b at $\phi_1=5V$ and $\phi_1=0V$, respectively. The potential difference between, for example, the levels 17'a and 17'b, which is determinative of the maximum quantity of charge per charge packet, is about 3V. The highest possible potential level 18 below the input gate 12 corresponding to $V_{in}$ minimum is determined by the potential level 15 of the input diode 10. The lowest effective potential level 18 below the input gate 12 corresponding to the highest input signal $V_{in}$ is determined by the height of the potential barrier 17a. If, as is shown in FIG. 2, $V_{in}$ exceeds this maximum value, the level 18 will fall below the potential level 17a. In this situation, it will no longer be possible to transfer every charge stored below the input gate 12 to the potential well 17b below the first clock electrode 4.

In practical embodiments, it has been found that the potential difference between the levels 18 and 17a is about 1V or smaller. Also, in view of the spread in the threshold voltage, this value is so small that in practice the surface potential below the input gate 12 often lies below the potential level 17a.

Figure 3:
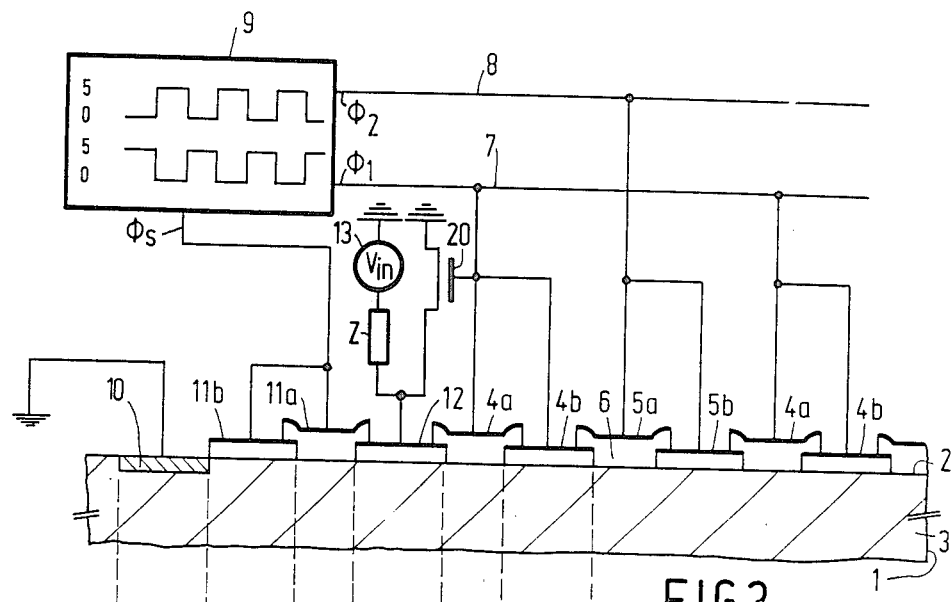
FIG. 3 shows the diagram of a semiconductor device according to the invention.
Figure 4:
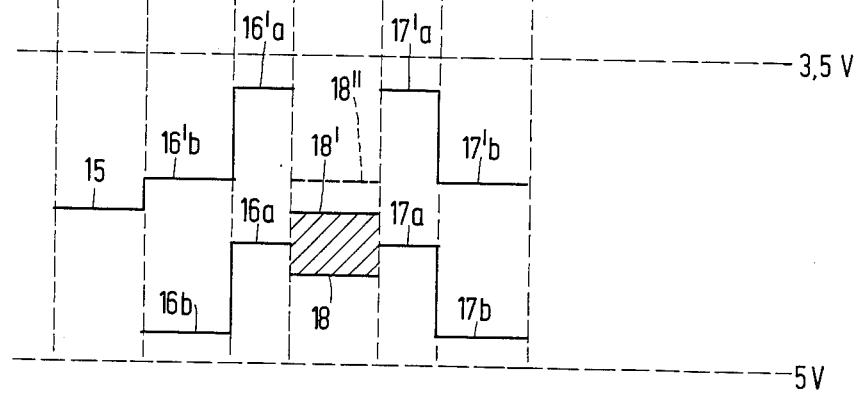
FIG. 4 shows a diagram of the potential distribution during operation in the device shown in FIG. 3.

FIG. 3 shows an embodiment of a device according to the invention. In contrast with the device shown in FIG. 1, the input stage 12 is now connected not only to the signal source 13, which supplies the input signal $V_{in}$, but also to a reference voltage, in this case ground, via the field effect transistor 20 acting as a switch. The remaining parts of the device are provided with the same reference numerals as in the device shown in FIG. 1 for the sake of simplicity. The transistor 20, whose channel is of the n-conductivity type, just like the channel 3, is controlled by the clock voltage $\phi_1$, which is also applied to the adjacent clock electrode 4. Consequently, the transistor 20 is activated at the same instant at which the clock electrodes 4 are activated, as a result of which the input gate 12 is connected to ground. The operation of the device is explained with reference to FIG. 4. Corresponding potential levels are provided in this Figure again with the same reference numerals as in FIG. 2. The maximum and minimum values of $V_{in}$ again correspond to the potential levels 18 and 18', respectively, in FIG. 4. As is shown in the drawing, it is now possible again that the level 18 lies below the potential level 17a, which with the applied clock voltage of 5V is the lowest potential level that can be attained below the transfer part 4a. Assume the initial situation in which $\phi_1=0V$ and $\phi_2=5V$ corresponding to the potential levels 17'a,17'b below the clock electrode 4 and to the potential levels 16b and 16a below the sample electrode 11b,11a. If an input signal $V_{in}$ is supplied, this value for $V_{in}$ is applied, because the switch 20 is non-conducting, to the input gate, as a result of which the surface potential below this gate corresponds in the absence of charge to the level 18. Subsequently, $\phi_1$ rises to 5V, while $\phi_2$ fails to 0V. Below the sample gate 11b, 11a, the potential barrier 16'b,16'a is formed, which insulates the charge packets below the input gate 12 and the input diode 10 from each other. Below the first clock electrode 4, the potential well 17b is induced, while the barrier 17'a is reduced to the level 17a. The major part of the charge packet above the level 18 would already be transferred to the potential well 17b. However, at the same time, the transistor 20 is activated, as a result of which the ground potential is applied to the input gate 12. This results in that the potential level below the input gate 12 rises to the level 18", which is indicated in the drawing by a broken line. Due to the fact that the level 18" lies above the level 17a, the whole charge packet formed below the input gate 12 will be transferred. At a next stage, $\phi_1$ returns to 0V, as a result of which the potential barrier 17a is increased again to 17'a. Simultaneously, the transistor 20 becomes non-conducting, as a result of which the input signal $V_{in}$ can be applied again to the input gate 12 and a new charge packet can be formed.

Figure 5:
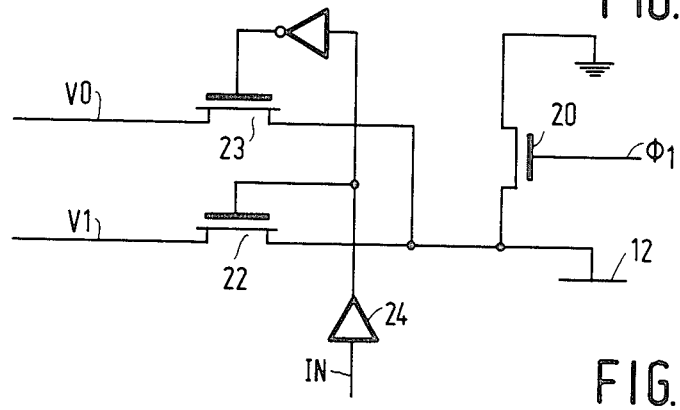
FIG. 5 shows an embodiment of the impedance Z in the device shown in FIG. 4.

For a satisfactory operation of the device described here, it is necessary that the impedance Z, which may form part of the signal source 13, is higher than the internal impedance of the switch 20 in the closed condition. FIG. 5 shows for a digital application, by way of example, the circuit diagram of a signal source 13 having an internal impedance Z which can be adjusted to a suitable value in a simple manner. The circuit comprises two field effect transistors 22,23, whose source zones are applied to a voltage $V_1$ corresponding to a logic "1" and to $V_0$ corresponding to a logic "0" respectively. The drain zones are connected to the input gate 12, shown diagrammatically. For the sake of clarity, the switching transistor 20 is also shown in the drawing.

The information IN is supplied to the input of an amplifier 24, of which the output is directly coupled to the gate of the transistor 22 and via an inverter stage 25 to the gate of the transistor 23. In the case in which IN=1, the transistor 22 is conducting and the voltage $V_1$ is applied to the input gate 12. In the other case, in which IN=0, the transistor 23 is conducting and the voltage $V_0$ is applied to the input gate 12. For the impedance Z, the resistance of the transistors 22,23 can be used. The said resistance can be adjusted to a suitable value, for example, by choosing the W/L ratio of (ratio channel width to channel length).

It will be appreciated that the invention is not limited to the embodiment shown here, but that many variations are possible for those skilled in the art within the scope of the invention. For example, the device described here with incorporated potential barrier may also be operated as a known one-bit per electrode device, in which there is in a group of successive filled storage sites only one vacancy, which is displaced through the charge transport channel in the direction opposite to the charge transport direction. The invention may also be used in known three- or four-phase CCD's without incorporated potential barrier.

What is claimed is:

1. A semiconductor device having a semiconductor body and comprising a charge-coupled device provided at a surface of said semiconductor body and comprising an input stage for forming charge packets in response to an input signal, and a row of clock electrodes provided with connection means for applying clock voltages for the sequential storage and transport of these charge packets in an underlying charge transport channel, the input stage comprising, viewed successively in the direction of charge transport, an input diode, a first electrode forming a sample gate and a second electrode forming an input gate, said input diode being provided with a connection for applying a fixed voltage, the input gate being provided with means for applying an input signal, and the sample gate being provided with means for applying a sample clock voltage for opening and closing the connection between the input diode and the region below the input gate, and further comprising an insulated gate field effect transistor, the input gate being connected to one of the main electrode regions of said insulated gate field effect transistor, the other main electrode region of said transistor being connected to a fixed potential during operation and the gate electrode of said transistor being provided with connection means for applying one of said clock voltages.

2. A semiconductor device as claimed in claim 1, characterized in that the conductivity type of the channel of the field effect transistor is the same as the conductivity type of the charge transport channel, and in that the same clock voltage is applied to the insulated gate electrode of the field effect transistor as to the first clock electrode, which, viewed in the direction of charge transport, succeeds the input electrode.

3. A semiconductor device as claimed in claim 1 or 2, characterized in that the clock electrodes each comprise a transfer part and a storage part, means being provided by which upon the application of clock voltages a potential barrier is induced below the transfer part and a potential well is induced below the storage part.

* * * * *